United States Patent [19]

Wagner et al.

[11] Patent Number: 4,956,196
[45] Date of Patent: Sep. 11, 1990

[54] METHOD FOR PRODUCING A CORROSION-RESISTANT COATING ON THE SURFACE OF LACQUERED WORKPIECES

[75] Inventors: Wolfgang Wagner, Neuberg; Klemens Ruebsam, Jossgrund; Helmut Kubik, Hesselroth; Stefan Heimrich, Bad Orb; Klaus Eckert, Hanau; Werner Pflueger, Hammersbach, all of Fed. Rep. of Germany

[73] Assignee: Leybold Aktiengesellschaft, Hanau, Fed. Rep. of Germany

[21] Appl. No.: 380,674

[22] Filed: Jul. 14, 1989

Related U.S. Application Data

[63] Continuation of Ser. No. 133,567, Dec. 16, 1987, abandoned.

[30] Foreign Application Priority Data

Sep. 21, 1987 [DE] Fed. Rep. of Germany ....... 3731686

[51] Int. Cl.$^5$ ............................................. B05D 3/06
[52] U.S. Cl. ...................................... 427/38; 427/39; 427/40; 427/41; 427/163; 427/250; 427/255.6; 427/255.7; 427/296; 427/322; 427/404; 427/412.1
[58] Field of Search ....................... 427/40, 38, 41, 39, 427/163, 296, 255.6, 255.7, 250, 322, 404, 412.1

Primary Examiner—Bernard Pianalto
Attorney, Agent, or Firm—Felfe & Lynch

[57] ABSTRACT

In a method and in an apparatus for the production of a corrosion-resistant coating of high reflectivity on the surface of workpieces, especially reflector inserts formed from plastic, in a vacuum chamber with a glow-discharge cathode and an evaporator, there is deposited on a coating consisting of a protective lacquer a second coating of a polymer, preferably of hexadimethylsilane, then a third coating of a metal, preferably aluminum, and lastly a fourth coating of a polymer, preferably of hexadimethylsilane. Both the metal evaporation and the polymerization of the protective coatings on the reflective coating and on the lacquer coating are performed in the same vacuum chamber.

4 Claims, 2 Drawing Sheets

METHOD FOR PRODUCING A CORROSION-RESISTANT COATING ON THE SURFACE OF LACQUERED WORKPIECES

This application is a continuation of application Ser. No. 133,567, filed Dec. 16, 1987, now abandoned.

BACKGROUND OF THE INVENTION

The invention relates to a method for producing a corrosion-resistant coating of high reflectivity on the surface of workpieces, especially reflector inserts formed from a plastic, in a vacuum chamber, with a glow discharge cathode and an evaporator.

A method is known for producing a protective coating on the surface of optical reflectors, preferably reflectors vapor-coated with aluminum, in a vacuum tank (DAS 26 25 448), in which the reflectors are exposed to a monomeric vapor of organic compounds, and in which the protective coating is precipitated by polymerization from the vapor phase by means of radiation from an electrical gas discharge, the protective coating being formed by the polymerization of an organic silicon substance.

Practice, however, has shown that it is not possible to achieve the production of a multilayer coating of a lacquer, an aluminum coating, and a single protective coating formed from a polymer, that has the corrosion resistance especially required by the automobile industry.

SUMMARY OF THE INVENTION

It is therefore the object of the present invention to offer a multi-layer coating which has outstanding corrosion resistance combined with an especially good reflectivity, and also to create the apparatus for its production.

According to the invention this object is accomplished by depositing in an evacuated vacuum chamber, on a first coating consisting of a protective lacquer, a second coating of a polymer, preferably hexadimethylsilane, then a third coating of a metal, preferably aluminum, and finally a fourth coating of a polymer, preferably hexadimethylsilane.

Preferably the second and fourth protective coatings are taken from a supply vessel in which the polymerizable substance is present in liquid form, and admitted in the form of a monomer vapor into the vacuum chamber.

It is advantageous during the polymerization of the protective coating to maintain a constant flow of monomeric vapor passing through the vacuum chamber. The metal evaporation for the production of the reflective coating, and the polymerization of the protective coatings on the reflective coating and lacquer coating, are both best performed in the same vacuum chamber in successive steps, as this will also result in an especially efficient and low-cost procedure.

The application of the two polymeric protective coatings and of the reflective aluminum coating is best performed in an apparatus having a vacuum chamber in which at least one thermal evaporation source and one glow-discharge cathode are provided, the evaporation source being formed by a tungsten coil and the aluminum wire that is to be evaporated being inserted into the space surrounded by the coil, while the substrates are held on supports which rotate in a planetary manner in the vacuum chamber.

DETAILED DESCRIPTION OF THE PREFERRED EMBODIMENTS

Figure 1:
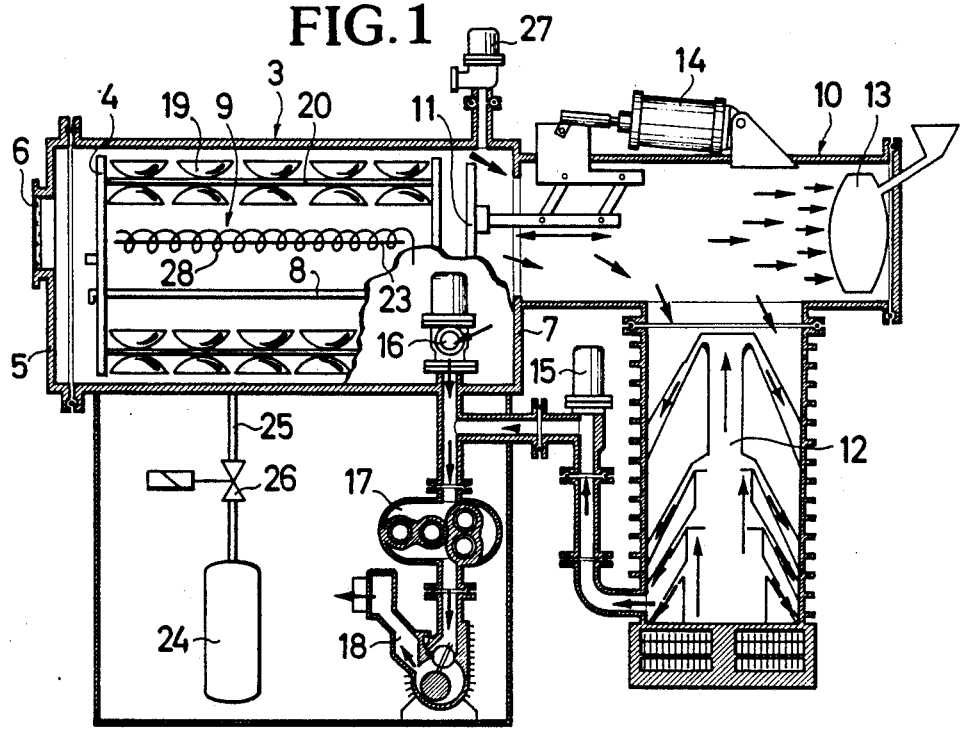
FIG. 1 is a diagrammatic section of a vapor deposition apparatus for metallizing headlight reflectors.

The vapor depositing system consists, according to FIG. 1, essentially of a hollow cylindrical vacuum chamber 3 with the loading cage 4 rotatably disposed therein, a removable cover 5 with a viewing glass 6, the incandescent cathode 8 reaching far into the vacuum chamber 3 and held on the bottom 7, an evaporator 9 also held on the bottom 7, a pumping system communicating with the vacuum chamber 3 through a forepumping valve 16 and a high-vacuum valve 11, and the diffusion pump 12, a cold trap 13, a system 14 for actuating the high-vacuum valve 11, a rotary piston pump 17 and a single-lobe vacuum pump 18.

Figure 2:
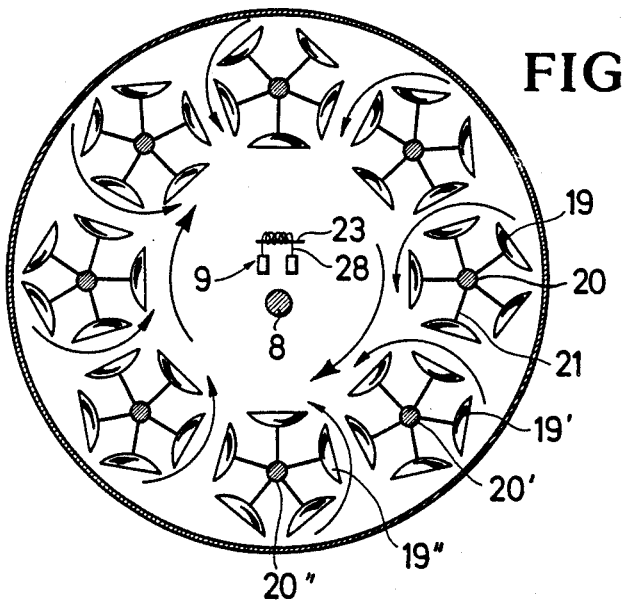
FIG. 2 is a diagrammatic section of the vacuum chamber of the apparatus.
Figure 3:
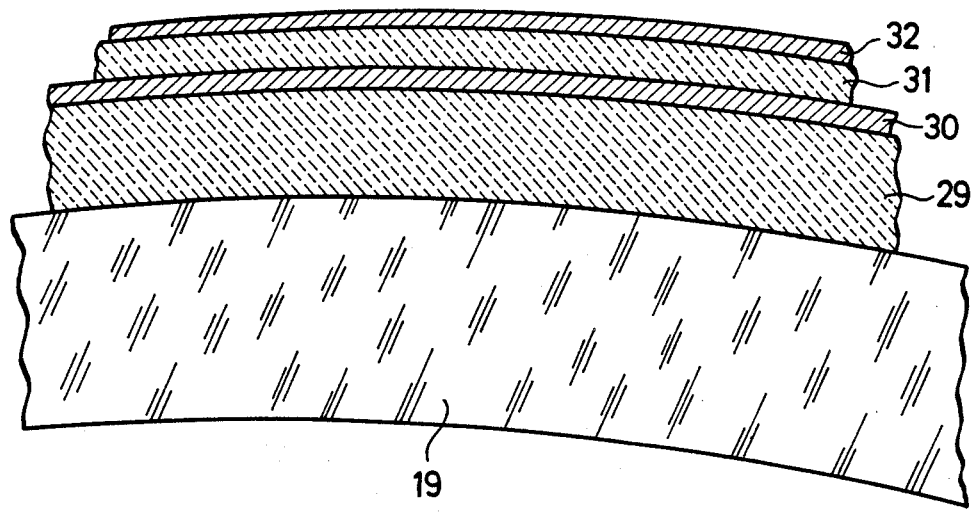
FIG. 3 is a partial cross section of a headlight reflector with four coatings thereon.

FIG. 2 shows a cross section through the vacuum chamber 3 and especially the loading cage 4 with the headlight reflectors 19, 19', . . . disposed thereon. The loading cage 4 is provided with a plurality of shafts 20, 20', . . . distributed on its circumference, each shaft 20, 20', . . . having in turn a plurality of holders 21, 21', . . . for holding the individual reflectors 19, 19', . . . A drive means with motor and transmission, not shown, is provided for the loading cage 4, and causes each single shaft 20, 20', . . . to rotate not only about its own longitudinal axis but also simultaneously about the longitudinal axis of the hollow cylindrical vacuum chamber during the coating process.

After the reflectors 19, 19', . . . have been lacquered they are dried and then introduced into the vacuum chamber 3 which is then evacuated. Before the vacuum coating operation, an intensive glow discharge can be produced for physical cleaning and to improve coating adhesion.

Then, by means of the cathode 8, a polymerization is performed by means of a plasma that is formed by admitting the monomer in vapor form into the vacuum chamber 3 from a supply vessel 24 in which the polymerizable substance, in this case hexadimethylsilane (commercially available under the trademark "Glipoxan"), is contained in liquid form. To enable the gas feed to be controlled, a regulating valve 26 is inserted into the gas supply line 25 and is controlled through an electrical circuit, which is not shown (the rest of the units such as pumps 12, 17 and 18, the flooding valve 27 and the forepumping valve 16, the system 14 for operating the high-vacuum valve 11, the glow discharge cathode 8 and the heater coil 28 of the evaporator 9 are included in this circuit).

After the application of the second coating 30 the chamber is further evacuated to the working vacuum necessary for vapor depositing and the drive means is turned on for the rotation of the reflectors 19, 19', . . . The thermal evaporation sources, i.e., the heating coils 28, are now heated to such an extent that the aluminum rods 23 inserted into them melt and the molten aluminum first spreads onto the coil 28. As the coils 28 continue to heat the aluminum evaporates and condenses on the parts such as the headlight reflectors 19, 19', . . . as a third coat 31. On this third coat 31, which forms the reflective coating, a fourth coat 32 is applied, which is equal in composition to the second coat 30, i.e., an organic silicon substance corresponding to the formula $(CH_3)_3SiSi(CH_3)_3$.

The coating consisting of the four layers 29 to 32 is characterized by an extraordinary corrosion resistance and adhesion combined with very good reflectivity. The four-layer coating (29 to 32) is especially usable in the case of headlight reflectors for motor vehicles, since the reflectors have no tendency to become worn or dull even after years of use.

We claim:

1. A method for producing a corrosion-resistant coating of high reflectivity on the surface of a plastic reflector insert comprising placing in a vacuum chamber, which contains a flow discharge cathode and thermal evaporator, a plastic reflector insert, the exposed surface of which contains a first coat consisting of a protective lacquer which was applied prior to treatment in said vacuum chamber, evacuating said chamber and subjecting said exposed lacquered surface on said plastic reflector insert to an intensive glow discharge to physically clean the surface thereof and improve adhesion, applying a second coat of hexadimethylsilane polymer onto the lacquer surface comprising said first coat, said polymer being formed by means of a plasma formed by admitting monomer into said vacuum chamber from an external source, then further evacuating said chamber to a vacuum sufficient to achieve vapor deposition and thereupon, using said thermal evaporator, applying a third coat of aluminum metal onto the exposed surface of said hexadimethylsilane polymer second coat and thereafter applying a fourth coat of hexadimethylsilane polymer equal in composition to said second coating onto the surface of said aluminum metal third coat.

2. The method according to claim 1 characterized in that the second and fourth protective coatings are admitted into said vacuum chamber as monomer vapor from an external supply tan in which the polymerizable hexadimethylsilane is present in liquid form.

3. The method according to claim 2 characterized in that during polymerization of the hexadimethylsilane polymer coatings, a constant flow of monomer vapor through said vacuum chamber is sustained.

4. The method according to claim 3 characterized in that both the metal evaporation for the production of the reflective coating and the polymerization of the hexadimethylsilane coatings on the reflective coating and the lacquer coating are performed in successive procedures in the same vacuum chamber.

* * * * *